US012696693B2

(12) United States Patent  
Anzalone et al.

(10) Patent No.: US 12,696,693 B2  
(45) Date of Patent: Jul. 28, 2026

(54) MANUFACTURING METHOD OF A SIC WAFER WITH RESIDUAL STRESS CONTROL

(71) Applicant: STMicroelectronics S.r.l., Agrate Brianza (IT)

(72) Inventors: Ruggero Anzalone, Viagrande (IT); Francesco La Via, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 394 days.

(21) Appl. No.: 17/534,156

(22) Filed: Nov. 23, 2021

(65) Prior Publication Data

US 2022/0172949 A1 Jun. 2, 2022

(30) Foreign Application Priority Data

Nov. 27, 2020 (IT) ........................ 102020000028778

(51) Int. Cl.  
*H10P 14/20* (2026.01)  
*H10P 14/60* (2026.01)  
*H10P 72/00* (2026.01)

(52) U.S. Cl.  
CPC ........ *H10P 14/3408* (2026.01); *H10P 14/274* (2026.01); *H10P 14/3438* (2026.01); *H10P 72/0616* (2026.01); *H10P 14/6339* (2026.01)

(58) Field of Classification Search  
CPC ........... H01L 21/02529; H01L 21/0257; H01L 21/02645; H01L 21/67288; H01L 21/0228;

(Continued)

(56) References Cited

U.S. PATENT DOCUMENTS

| | | | |
|---|---|---|---|
| 3,108,818 | A | 10/1963 | Furstenburg |
| 3,777,009 | A | 12/1973 | Menashi et al. |

(Continued)

FOREIGN PATENT DOCUMENTS

| | | |
|---|---|---|
| CN | 104465392 A | 3/2015 |
| CN | 104756244 A | 7/2015 |

(Continued)

OTHER PUBLICATIONS

Gubanov et al., "Doping in cubic silicon-carbide," *Applied Physics Letters* 75(1):88-90, Jul. 5, 1999.

(Continued)

*Primary Examiner* — Fernando L Toledo  
*Assistant Examiner* — Jahae Kim  
(74) *Attorney, Agent, or Firm* — Seed Intellectual Property Law Group LLP

(57) ABSTRACT

A production process of a SiC wafer carried out in a same reaction chamber includes forming, on a support, a first SiC layer. The support is separated from the first SiC layer. A second SiC layer is grown on the first SiC layer, which includes introducing into the reaction chamber a precursor in the gaseous phase of a first dopant having a first electrical conductivity to generate a first stress in the second SiC layer, and introducing into the reaction chamber a precursor in the gaseous phase of a second dopant having a second electrical conductivity opposite to the first electrical conductivity, to generate a second stress in the second SiC layer that is opposite to, and balances, the first stress. The SiC wafer is thus without effects of warpage.

18 Claims, 2 Drawing Sheets

(58) Field of Classification Search
CPC ......... H01L 21/02447; H01L 21/02378; H01L
21/02576; H01L 21/02579; H01L 21/0262
See application file for complete search history.

(56) References Cited

U.S. PATENT DOCUMENTS

| | | | |
|---|---|---|---|
| 3,922,712 A | 11/1975 | Stryker | |
| 4,537,651 A | 8/1985 | Shuskus et al. | |
| 4,574,730 A | 3/1986 | Svilans | |
| 4,582,561 A | 4/1986 | Ioku et al. | |
| 4,845,539 A | 7/1989 | Inoue | |
| 5,183,529 A | 2/1993 | Potter et al. | |
| 5,277,933 A | 1/1994 | Claar et al. | |
| 5,288,326 A | 2/1994 | Maeda et al. | |
| 5,923,408 A | 7/1999 | Takabayashi | |
| 6,067,680 A * | 5/2000 | Pan ................... | H01L 21/76877 |
| | | | 257/E21.585 |
| 6,367,803 B1 | 4/2002 | Loth | |
| 7,736,528 B2 | 6/2010 | Okita et al. | |
| 8,049,203 B2 | 11/2011 | Samuelson et al. | |
| 8,563,380 B2 | 10/2013 | Richter et al. | |
| 8,890,103 B2 | 11/2014 | D'Arrigo et al. | |
| 8,933,464 B2 * | 1/2015 | Nishio ................... | C30B 29/36 |
| | | | 257/77 |
| 9,318,583 B2 | 4/2016 | Verhulst et al. | |
| 9,406,504 B2 | 8/2016 | Frisina et al. | |
| 9,461,182 B2 | 10/2016 | Sommer | |
| 10,475,673 B2 | 11/2019 | Anzalone et al. | |
| 2002/0072249 A1 | 6/2002 | Nagasawa et al. | |
| 2006/0110893 A1 | 5/2006 | Quenzer et al. | |
| 2006/0233670 A1 | 10/2006 | Lehto | |
| 2007/0228491 A1 | 10/2007 | Forbes | |
| 2007/0266931 A1 | 11/2007 | Mueller et al. | |
| 2008/0069951 A1 | 3/2008 | Chacin et al. | |
| 2008/0202424 A1 | 8/2008 | Pozzetti et al. | |
| 2009/0175777 A1 | 7/2009 | Scarsbrook et al. | |
| 2009/0255901 A1 | 10/2009 | Okita et al. | |
| 2010/0176459 A1 | 7/2010 | Wernersson et al. | |
| 2010/0200916 A1 | 8/2010 | Gossner et al. | |
| 2010/0270593 A1 | 10/2010 | Lung et al. | |
| 2011/0049476 A1 | 3/2011 | Bjoerk et al. | |
| 2011/0233512 A1 | 9/2011 | Yang et al. | |
| 2012/0052632 A1 | 3/2012 | Sato et al. | |
| 2012/0067274 A1 | 3/2012 | Hara et al. | |
| 2012/0187376 A1 | 7/2012 | Tomioka et al. | |
| 2013/0037857 A1 | 2/2013 | Von Kanel et al. | |
| 2013/0109192 A1 | 5/2013 | Hawkins et al. | |
| 2013/0157448 A1 | 6/2013 | Frisina et al. | |
| 2014/0021532 A1 | 1/2014 | Bhuwalka et al. | |
| 2014/0054549 A1 | 2/2014 | Loh et al. | |
| 2014/0203350 A1 | 7/2014 | Chuang et al. | |
| 2014/0203351 A1 | 7/2014 | Chuang et al. | |
| 2014/0203352 A1 | 7/2014 | Chuang et al. | |
| 2014/0231902 A1 | 8/2014 | Chuang et al. | |
| 2014/0264385 A1 | 9/2014 | Massimo et al. | |
| 2014/0284619 A1 * | 9/2014 | Nishio ................ | H10D 62/405 |
| | | | 257/77 |
| 2016/0133504 A1 | 5/2016 | Chu et al. | |
| 2016/0348222 A1 | 12/2016 | Isaac | |
| 2017/0045828 A1 | 2/2017 | Van Sommeren et al. | |
| 2017/0130335 A1 | 5/2017 | Yamada et al. | |
| 2018/0090350 A1 | 3/2018 | Anzalone et al. | |
| 2018/0171471 A1 | 6/2018 | Takahashi et al. | |
| 2018/0209063 A1 | 7/2018 | Myronov et al. | |
| 2019/0080951 A1 | 3/2019 | Huston et al. | |
| 2019/0177852 A1 * | 6/2019 | Oku ........................ | C23F 1/02 |
| 2019/0304838 A1 | 10/2019 | Saeki et al. | |
| 2020/0098573 A1 * | 3/2020 | Sameshima ......... | C23C 16/0272 |
| 2020/0144047 A1 | 5/2020 | Anzalone et al. | |
| 2020/0185220 A1 | 6/2020 | Daigo | |
| 2020/0234996 A1 | 7/2020 | Rokkam et al. | |
| 2020/0357637 A1 | 11/2020 | Rupp et al. | |
| 2021/0062361 A1 | 3/2021 | Anzalone et al. | |
| 2021/0233798 A1 | 7/2021 | Alaniz et al. | |
| 2021/0263418 A1 | 8/2021 | Scholten et al. | |
| 2022/0208541 A1 * | 6/2022 | Anzalone ......... | H01L 21/02008 |
| 2023/0257904 A1 * | 8/2023 | Daigo .................... | C30B 25/12 |
| | | | 118/725 |
| 2023/0295836 A1 | 9/2023 | Anzalone et al. | |

FOREIGN PATENT DOCUMENTS

| | | | | |
|---|---|---|---|---|
| EP | 0504712 A1 * | 9/1992 | ............. | C30B 25/02 |
| EP | 2378557 A1 | 10/2011 | | |
| EP | 2 782 117 A1 | 9/2014 | | |
| EP | 2808897 A1 | 12/2014 | | |
| JP | 2014031316 A | 2/2014 | | |
| JP | 2017183730 A | 10/2017 | | |
| JP | 2019151543 A | 9/2019 | | |
| WO | WO 2014006503 A2 | 1/2014 | | |

OTHER PUBLICATIONS

Jian-Feng et al., "Effect of Al Doping on Properties of SiC Films," *Chin.Phys.Lett.* 25(9):3346-3349, 2008.

Sun et al., "Combined effects of Ga, N, and Al cooping in solution grown 3C—SiC," Journal of Applied Physics 108, 013503, 2010, 10 pages.

* cited by examiner

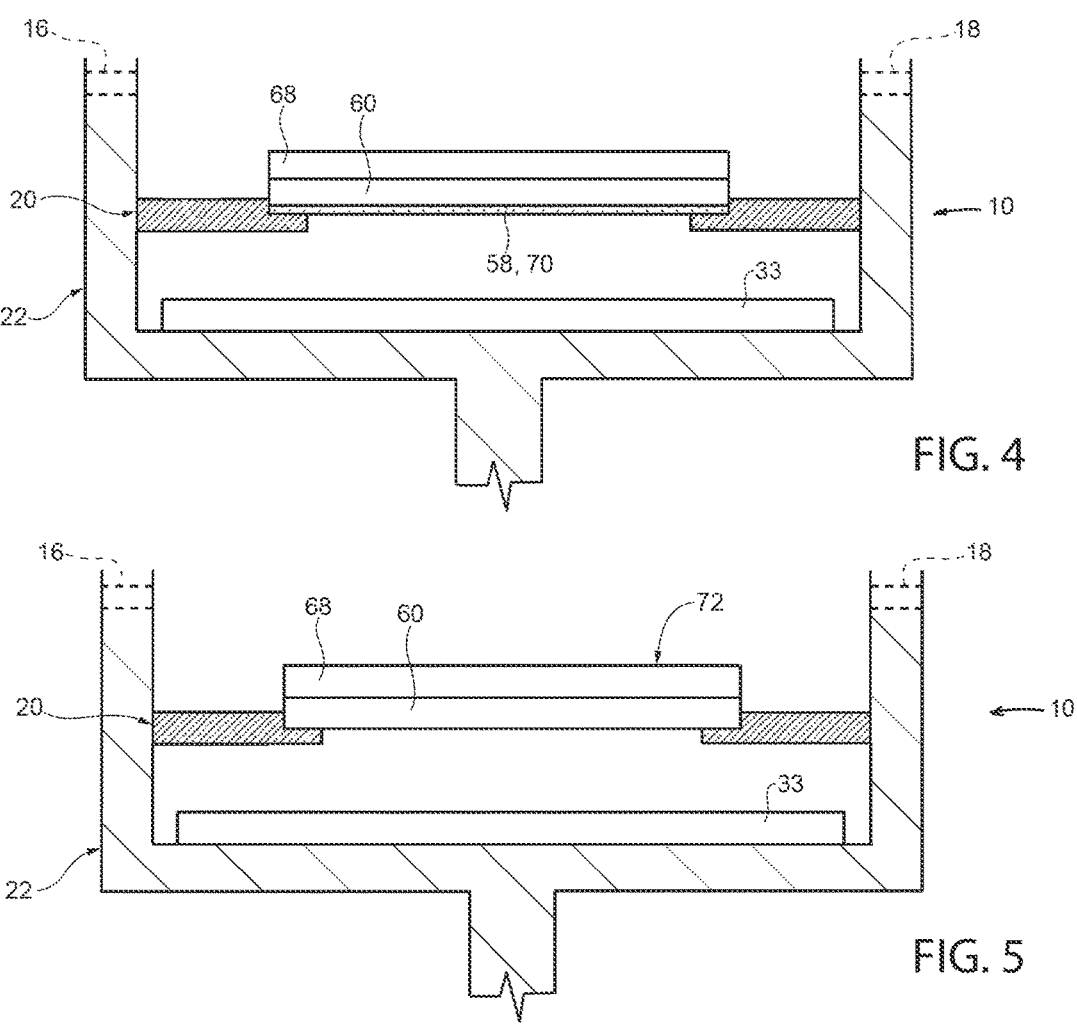
FIG. 4
FIG. 5
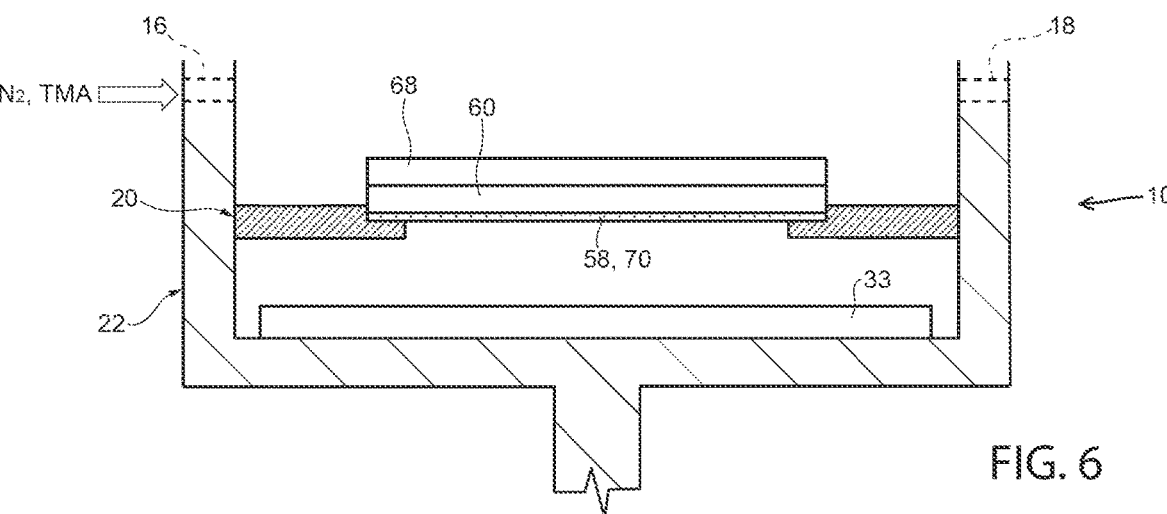
FIG. 6

MANUFACTURING METHOD OF A SIC WAFER WITH RESIDUAL STRESS CONTROL

BACKGROUND

Technical Field

The present disclosure relates to a production process of a SiC wafer with control of residual stress.

Description of the Related Art

As is known, semiconductor devices are typically manufactured in silicon wafers. However, silicon-carbide wafers (SiC) have become increasingly popular thanks, at least partially, to the favourable chemico-physical properties of SiC. For instance, SiC generally has a wider bandgap than silicon. Consequently, even with relatively small thicknesses, SiC has a breakdown voltage higher than silicon and therefore can be advantageously used in high-voltage applications, such as power devices.

Silicon carbide can be found in different crystallographic forms or polytypes. The most common polytypes are the cubic polytype (3C-SiC polytype), the hexagonal polytype (4H-SiC and 6H-SiC polytypes) and the rhombohedral polytype (15R-SiC polytype). Amongst these, currently the 3C-SiC cubic polytype is the object of in-depth study, thanks to its unique properties as compared to other wafer polytypes. For instance, generally 3C-SiC wafers have a smaller trap density on the $SiO_2$/3C-SiC interface and have a greater mobility of the channel electrons. Other characteristics that render 3C-SiC interesting consist of the low value of the ON-state resistance $R_{on}$, which is particularly useful in the case of devices that work up to and beyond 650 V.

However, manufacture of silicon-carbide wafers is more complex than that of silicon wafers, and no 3C-SiC substrates are currently available on the market.

In particular, the present applicant has found a tendency to warpage of silicon-carbide wafers, which, in fact, become unusable for manufacturing electronic devices. This phenomenon is more visible in wafers of large dimensions, in particular ones measuring more than 6 inches.

BRIEF SUMMARY

The present disclosure provides various embodiments of a production process or manufacturing method of a silicon-carbide wafer that overcomes the drawbacks of the known art and will enable manufacturing of silicon-carbide wafers even of large dimensions.

According to the present disclosure, a production process or manufacturing method of a silicon-carbide wafer is provided.

In at least one embodiment, a production process of a silicon-carbide (SiC) wafer carried out in a same reaction chamber is provided that includes: forming, on a support, a first SiC layer; separating the support from the first SiC layer; and growing a second SiC layer on the first SiC layer. The growing the second SiC layer includes: introducing into the reaction chamber a precursor in gaseous phase of a first dopant having a first electrical conductivity to generate a first stress in the second SiC layer; introducing into the reaction chamber a precursor in gaseous phase of a second dopant having a second electrical conductivity opposite to the first electrical conductivity to generate a second stress in the second SiC layer that is opposite to the first stress; and at least partially removing the support from the seed SiC layer.

In at least one embodiment, a method is provided that includes: forming a seed silicon carbide (SiC) layer on a substrate in a reaction chamber, the seed SiC layer having a thickness less than 10 nm; at least partially removing the substrate from the first SiC layer; and forming a second SiC layer on the first SiC layer, the forming the second SiC layer including: generating a first stress in the second SiC layer by introducing into the reaction chamber a precursor in gaseous phase of a first dopant having a first electrical conductivity; and generating a second stress in the second SiC layer that is opposite to the first stress by introducing into the reaction chamber a precursor in gaseous phase of a second dopant having a second electrical conductivity opposite to the first electrical conductivity.

In at least one embodiment, a method includes: forming a seed silicon carbide (SiC) layer on a semiconductor substrate in a reaction chamber at a first temperature, the seed SiC layer having a first thickness; removing at least a portion of the semiconductor substrate from the first SiC layer by heating the reaction chamber to a second temperature that is greater than the first temperature, the second temperature being greater than a melting temperature of the semiconductor substrate and less than a melting temperature of the first SiC layer; and forming a second SiC layer on the first SiC layer, the second SiC layer having a second thickness that is greater than the first thickness, the forming the second SiC layer including: generating a first stress in the second SiC layer by introducing into the reaction chamber a precursor in gaseous phase of a first dopant having a first electrical conductivity; and generating a second stress in the second SiC layer that is opposite to the first stress by introducing into the reaction chamber a precursor in gaseous phase of a second dopant having a second electrical conductivity opposite to the first electrical conductivity.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein:

FIGS. 1 to 6 show an embodiment of a production process, or manufacturing process, of a silicon-carbide wafer, in particular a 3C-SiC wafer.

DETAILED DESCRIPTION

Figures 1, 2, 3:
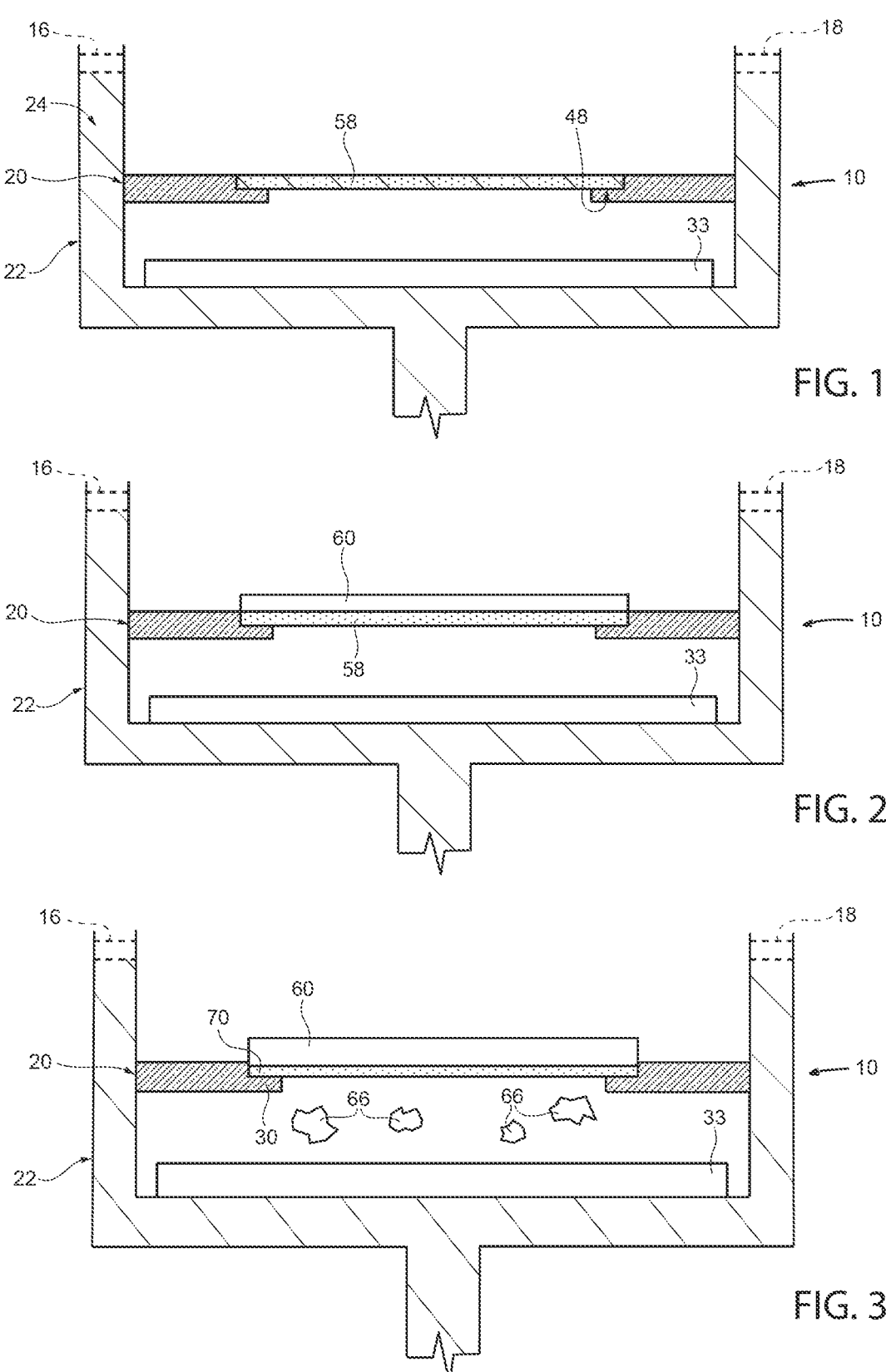

The steps of FIGS. 1-3 are of a known type and are here described for completeness and for favouring understanding of the present disclosure.

In FIGS. 1-6, the production process or manufacturing method of a silicon-carbide wafer is illustrated with reference to an apparatus 10 for chemical vapor deposition (CVD) growth. The apparatus includes a reaction chamber 24, delimiting a closed space where chemical reactions of growth and doping of the SiC wafer take place. The apparatus 10 comprises, a heater (not illustrated), an inlet duct 16 and an outlet duct 18. The apparatus 10 further comprises a support 20 (also referred to as "susceptor") and a container 22, which is, for example, cup-shaped. The support 20 and the container 22 are positioned inside the reaction chamber 24. The heater is configured to heat the reaction chamber 24 and what is contained inside the reaction chamber 24 (for example, the support 20, the container 22, gases, substrates, wafers, or other objects or substances). The inlet duct 16 provides a fluidic path from the environment external to the apparatus 10 towards the reaction chamber 24 and may be used for introducing precursors and gases into the reaction chamber 24. The outlet duct 18 provides a fluidic path from the reaction chamber 24 towards the outside of the apparatus 10. It may also be used for discharging reaction gases formed in the reaction chamber 24 towards the outside. The support 20 is arranged on the container 22 and in the reaction chamber 24. The support 20 constitutes a platform for receiving and retaining a substrate or a wafer inside the reaction chamber 24. In particular, as discussed below, a silicon substrate is arranged on the support 20 during manufacturing of a SiC wafer.

An apparatus of the type described above, or the like, may be implemented, for example, as described by US 2018/090350, which describes a susceptor formed by a plurality of bars having an inclined shape or facing downwards. Also the patent document No. US 2020/144047 describes an apparatus similar to the apparatus 10 and provided with a susceptor usable to implement the present disclosure.

In detail, in FIG. 1, a substrate 58 of a first material, here a silicon substrate, is positioned in the reaction chamber 24, and precisely in a seat 48 of the support 20. The substrate 58 is inserted into the seat 48.

The substrate 58 has the smallest possible thickness, compatibly with characteristics of brittleness. For instance, the substrate 58 may have a thickness of at least 60-70 μm, in particular comprised between 200 μm and 300 μm.

The substrate 58 generally has a crystalline structure. Moreover, in this step, the reaction chamber 24 is at room temperature.

Once the substrate 58 is positioned in the support 20, the reaction chamber 24 is sealed and heated by the heater to a first temperature. For instance, the first temperature may be comprised between 450° C. and 550° C. A first pressure level is also set inside the reaction chamber 24, for example comprised between $8 \cdot 10^{-5}$ bar and $12 \cdot 10^{-5}$ bar.

After the reaction chamber 24 has been heated to the first temperature, it is brought to a second temperature, higher than the first temperature. For instance, the second temperature may be comprised between 1050° C. and 1150° C. A second pressure level is also set inside the reaction chamber 24, higher than the first pressure level, for example comprised between 75 mbar and 125 mbar.

The reaction chamber 24 is kept at the second pressure level for the rest of the process.

After the reaction chamber 24 has been heated to the second temperature, the substrate 58 is immersed in hydrogen ($H_2$). The hydrogen is introduced into the reaction chamber 24 through the inlet duct 16. In addition, the substrate 58 is subjected to activation operations, by introducing hydrochloric acid (HCl) into the reaction chamber 24 through the inlet duct 16.

The reaction chamber 10 is then heated by the heater to a third temperature, higher than the second temperature. For instance, the third temperature is comprised between 1340° C. and 1400° C.

Once again with reference to FIG. 1, while the reaction chamber 24 is brought to the third temperature or after it has reached the third temperature, a carbon-based precursor is introduced into the reaction chamber 24 through the inlet duct 16. The carbon-based precursor carbonizes the surface silicon atoms of the substrate 58 to form a thin SiC layer, in particular a 3C-SiC layer. In one or more embodiments, the thin SiC layer has a thickness less than 10 nm, and in some embodiments, a few nanometres. This step is also referred to as "ramp carbonization." As will be discussed hereinafter, the thin SiC layer acts as seed for growth of a further thicker SiC layer (in particular, of the 3C-SiC polytype).

When the reaction chamber 24 is at the third temperature, a silicon-based precursor is added to the carbon-based precursor in the reaction chamber 24. Consequently, a first SiC layer 60 starts to grow epitaxially from the thin SiC layer, as illustrated in FIG. 2. This step is frequently defined as "hetero-epitaxial growth." The first SiC layer 60 is the SiC seed layer previously mentioned.

Then, a melting process is carried out. In particular, the melting is carried out by maintaining a flow of $H_2$ in the reaction chamber 24 through the inlet duct 16. During melting, the reaction chamber 24 is heated by the heater up to a fourth temperature, higher than or equal to the melting temperature of the substrate 58 and lower than the melting temperature of the first SiC layer 60. For instance, the fourth temperature is comprised between 1550° C. and 1650° C. Consequently, as illustrated in FIG. 3, the substrate 58 melts (designated by 66 in FIG. 3) and deposits in the container 22, harvested by an absorber material 33 (e.g., a spongy material).

The reaction chamber 24 can be kept at the fourth temperature until all the substrate 58 is removed from the first SiC layer 60, or until smaller portions or a thin residual layer 70 of the substrate 58 remain on the support 20 (the residual layer 70 of the substrate 58 is then removed by an etching process).

In FIG. 4, a silicon-and-carbon-based precursor is introduced into the reaction chamber 24 through the inlet duct 16. Then, the first SiC layer 60 continues to grow in thickness or a second SiC layer 68 starts to grow on the first SiC layer 60 (e.g., by the CVD process). This step is frequently referred to as "homo-epitaxial growth." The silicon-and-carbon-based precursor can be supplied during the melting step of the substrate 58. Alternatively, the silicon-and-carbon-based precursor is supplied after the melting process of the substrate 58 is completed.

When the second SiC layer 68 reaches a desired thickness, the flow of the silicon-and-carbon-based precursor is stopped. Any possible reaction gases in the reaction chamber 24 are removed from the reaction chamber 24 through the outlet duct 18.

With reference to FIG. 5, in the case where the SiC wafer contains residual portions 70 of the substrate 58, these can be removed by an etching process during growth of the second SiC layer 68 or at the end of said growth. In this case, an etching chemistry (in particular, in gaseous form), such as hydrochloric acid (HCl), is introduced into the reaction chamber 24 through the inlet duct 16, which acts by removing the residual portions 70, which in turn are extracted from the chamber 24 through the outlet duct 18.

A SiC wafer 72 is thus obtained. The SiC wafer 72 has a diameter comprised between 2 and 12 inches, and in some embodiments, equal or substantially equal to 6 inches.

The SiC wafer 72 can be used, for example, as a substrate for the manufacturing of electronic devices (e.g., by growing further layers on it and/or carrying out steps of dopant implantations and activations, lithography, etc.).

According to an aspect of the present disclosure, during the step of FIG. 4, doping of the SiC layer 68 is carried out during the step of CVD growth. This aspect of the disclosure is illustrated in FIG. 6, which reproduces the step of FIG. 4.

Doping here has the dual function of setting a desired value of electrical resistivity of the wafer 72 as a function of subsequent steps of formation of electronic components, and of regulating a net stress value to which the SiC wafer 72 is subject at the end of the manufacturing steps.

In detail, in an embodiment of the present disclosure, the doping process of the second SiC layer 69 is carried out by simultaneously providing, during CVD growth, two different dopant species, one of which is an N type and one is a P type; the dopant species are, for example, provided by using precursors in the gaseous phase, such as nitrogen ($N_2$) for a doping of an N type, and trimethyl aluminium, TMA or $Al_2(CH_3)_6$, for a doping of a P type by aluminium atoms.

The present applicant has found that, by appropriately calibrating the concentrations of N and P dopants in the SiC wafer 72 (or, equivalently, the dose of dopant or precursor introduced into the reaction chamber) it is possible to regulate the tensile and compressive stresses of the SiC wafer 72. In fact, the compressive and tensile stresses act in a direction orthogonal to the defined plane of the surface of the SiC wafer 72 and tend to bend it in mutually opposite directions. The doping of an N type carried out by $N_2$ enables regulation of the stress in a compressive direction (it acts in a first direction), whereas the doping of a P type carried out by TMA enables regulation of the stress in a tensile direction (it acts in a second direction parallel and opposite to the first direction).

The present applicant has found that the desired stress balancing is obtained by introducing, into the reaction chamber 24, precursors in the gaseous phase with a flow, measured in sccm (standard cubic centimetres per minute), that respects the following proportion. Given a flow of nitrogen equal to "x" sccm, chosen as a function of the doping of an N type that it is desired to obtain in the SiC wafer 72, the flow "y" of TMA is comprised between 0.01% and 1% of the value of x. For instance, considering a reaction chamber 24 with an internal volume of approximately 2100 cm³, the values of x may range between 500 and 1800 sccm, and the values of y may range between 0.1 and 5 sccm, these values being chosen so as to respect the aforementioned proportion.

It is evident that the flow values, expressed in sccm, may vary as a function of the size of the reaction chamber used and/or of the desired dopant concentration at the level of the SiC wafer 72.

In order to balance the stress at the wafer level, the applicant verified that the N-type dopant ($N_2$) concentration can be set in the range of $10^{18}$ atoms/cm³-$10^{20}$ atoms/cm³, and the P-type dopants (Al) concentration can be set in the range of $10^{17}$ atoms/cm³-$10^{19}$ atoms/cm³. More in particular, the applicant verified that substantially flat wafers 72 can be obtained with N-type dopant concentration in the range $2 \cdot 10^{19}$ atoms/cm³-$6 \cdot 10^{19}$ atoms/cm³, and P-type dopant concentration in the range $1.5 \cdot 10^{18}$ atoms/cm³-$7 \cdot 10^{18}$ atoms/cm³. The balance of the stress using the above values is particularly effective with 3C-SiC.

The concentration of dopants can, in general, vary according to the electrical requirements of the wafer thus manufactured. For instance, to obtain a SiC wafer 72 with a net doping of an N type, measured at the level of the SiC wafer 72, of the order of $10^{18}$ atoms/cm³ (e.g., between $1 \times 10^{18}$ and $10 \times 10^{18}$ atoms/cm³), the concentration of N dopants measured at the level of the wafer 72 is between $4 \cdot 10^{18}$ and $1.5 \cdot 10^{19}$ atoms/cm³ and the concentration of dopants P (aluminium) measured at the level of the wafer 72 is higher than higher than $10^{17}$ atoms/cm³ (e.g., $1 \cdot 10^{18}$ atoms/cm³) and lower than $10^{19}$ atoms/cm³ (e.g., $8 \cdot 10^{18}$ atoms/cm³).

In at least one embodiment, the manufacturing process described above is carried out in the same the reaction chamber 24, in particular without removing from the reaction chamber 24 the product under manufacturing (i.e., the SiC wafer 72 and its intermediate products formed by the stack of two or more among substrate 58, layer 60 and layer 68). The applicant found that in case the SiC wafer 72 (or its intermediate products) is removed from the reaction chamber 24 during an intermediate step of manufacturing, there is a high risk of breakage of the SiC wafer 72 (or of its intermediate products). In particular, if any of the stacks formed with reference to FIGS. 2 to 4 is removed from the reaction chamber 24 to perform a step of removal of the substrate 58 (e.g., using a delamination process), such stack would most probably break or crack during the removal process. On the contrary, by carrying out a process of melting the substrate 58 in the reaction chamber 24 as discussed with reference to FIG. 3 and, if necessary, completing the process by the etching step discussed with reference to FIG. 4, layers 60 and 68 are not compromised and the SiC wafer 72 thus obtained does not show cracks or other physical damages.

Finally, it is clear that modifications and variations may be made to the apparatus and to the method described and illustrated herein, without thereby departing from the scope of the present disclosure.

For instance, the teaching of the present disclosure likewise applies for obtaining a net doping of a P type on the SiC wafer, balancing the effect of the stress by introduction of dopant species of an N type.

Furthermore, for a doping of an N type, dopant species alternative to nitrogen may be used, for example phosphorus (P); for a doping of a P type, dopant species alternative to aluminium may be used, for example boron (B).

A method for manufacturing a silicon-carbide, SiC, wafer may be summarized as including the steps of introducing a substrate (58) in a reaction chamber (24); forming a first SiC layer (60) on the substrate (58); separating the substrate (58) from the first SiC layer (60); growing a second SiC layer (68) on the first SiC layer (60) until a desired thickness is reached, characterized in that the step of growing the second SiC layer (68) comprises the at least partially simultaneous sub-steps of introducing into the reaction chamber (24) a precursor in gaseous phase of a first dopant having a first electrical conductivity (N) and such as to generate a first stress in the second SiC layer (68); introducing into the reaction chamber (24) a precursor in gaseous phase of a second dopant having a second electrical conductivity (P) opposite to the first electrical conductivity (N), and such as to generate a second stress in the second SiC layer (68) that is opposite to the first stress.

The precursor of the first dopant may be nitrogen, $N_2$.

The precursor of the second dopant may be trimethylaluminium, TMA.

Said precursor of the second dopant may be introduced into the reaction chamber (24) with a flow, expressed in sccm, having a value comprised between 0.01% and 1% of the flow, expressed in sccm, of the precursor of the first dopant.

Said precursor of the first dopant may be introduced into the reaction chamber (24) so as to generate, in the second SiC layer (68), a concentration of the first dopant of the order of $10^{18}$ atoms/cm³, and said precursor of the second dopant may be introduced into the reaction chamber (24) so as to generate, in the second SiC layer (68), a concentration of the second dopant comprised between $10^{17}$ atoms/cm³ and $10^{19}$ atoms/cm³.

The first electrical conductivity may be of an N type, the second electrical conductivity may be of a P type, the first stress may be of a compressive type and the second stress may be of a tensile type.

The step of forming the first SiC layer (60) may include the at least partially simultaneous sub-steps of introducing into the reaction chamber (24) said precursor in the gaseous phase of the first dopant; and introducing into the reaction chamber (24) said precursor in the gaseous phase of the second dopant.

The material of the first and second layers (60', 60") may be 3C-SiC.

The step of growing the second material may include carrying out a CVD growth in the presence of said precursors of the first and second dopants.

Said wafer may have a diameter of 6 inches.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A production process of a silicon-carbide (SiC) wafer carried out in a same reaction chamber, comprising:

forming a first SiC layer on a substrate, the substrate having a first end suspended by a first support and a second end suspended by a second support, the first end being opposite the second end along a first direction, a center of the substrate being exposed from the first and second supports, the first and second supports each having a first dimension along the first direction greater than a second dimension transverse to the first direction;

removing a first portion of the substrate from the first SiC layer by at least partially melting the substrate, the first portion being a continuous portion extending entirely from the first end to the second end along the first direction; and growing a second SiC layer on a first surface of the first SiC layer opposite the substrate, the second SiC layer entirely covering the first surface, wherein the growing the second SiC layer includes:

introducing into the reaction chamber a precursor in gaseous phase of a first dopant having a first electrical conductivity to generate a first stress in the second SiC layer;

introducing into the reaction chamber a precursor in gaseous phase of a second dopant having a second electrical conductivity opposite to the first electrical conductivity to generate a second stress in the second SiC layer that is opposite to the first stress; and removing a second portion of the substrate, the second portion being a residual portion remaining after removal of the first portion, completely by etching from the first SiC layer.

2. The process according to claim 1, wherein the melting the substrate is carried out by heating the reaction chamber up to a temperature that is at least equal to a melting temperature of the substrate, and less than a melting temperature of the first SiC layer.

3. The process according to claim 1, wherein a thickness of the second SiC layer is greater than a thickness of the first SiC layer.

4. The process according to claim 1, wherein the first SiC layer is a 3C-SiC layer.

5. The process according to claim 1, wherein the second SiC layer is a 3C-SiC layer.

6. The process according to claim 1, wherein the precursor of the first dopant is nitrogen ($N_2$).

7. The process according to claim 1, wherein the precursor of the second dopant is trimethylaluminium (TMA).

8. The process according to claim 1, wherein the precursor of the second dopant is introduced into the reaction chamber with a flow, expressed in sccm, having a value in the range of 0.01% and 1% of a flow, expressed in sccm, of the precursor of the first dopant.

9. The process according to claim 1, wherein the precursor of the first dopant is introduced into the reaction chamber to generate, in the second SiC layer, a concentration of the first dopant that is one order of magnitude greater than a respective concentration of the second dopant.

10. The process according to claim 1, wherein the precursor of the first dopant is introduced into the reaction chamber to generate, in the second SiC layer, a concentration of the first dopant in the range of $2 \cdot 10^{19}$ atoms/cm$^3$ and $6 \cdot 10^{19}$ atoms/cm$^3$, and wherein the precursor of the second dopant is introduced into the reaction chamber to generate, in the second SiC layer, a concentration of the second dopant in the range of $1.5 \cdot 10^{18}$ atoms/cm$^3$ and $7 \cdot 10^{18}$ atoms/cm$^3$.

11. The process according to claim 1, wherein the first electrical conductivity is of an N type, the second electrical conductivity is of a P type, the first stress is of a compressive type and the second stress is of a tensile type.

12. The process according to claim 1, wherein the forming the first SiC layer comprises:

introducing into the reaction chamber the precursor in the gaseous phase of the first dopant; and introducing into the reaction chamber the precursor in the gaseous phase of the second dopant.

13. The process according to claim 1, wherein, to grow the first SiC layer, the precursor in gaseous phase of the first dopant and the precursor in gaseous phase of the second dopant are introduced into the reaction chamber simultaneously.

14. The process according to claim 1, wherein, to grow the second SiC layer, the precursor in gaseous phase of the first dopant and the precursor in gaseous phase of the second dopant are introduced into the reaction chamber simultaneously.

15. The process according to claim 1, wherein the growing the second SiC layers includes carrying out a CVD growth in the presence of the precursors of the first and second dopants.

16. A method, comprising:

forming a seed silicon carbide (SiC) layer on a substrate in a reaction chamber, the seed SiC layer having a thickness less than 10 nm, the substrate having a first end suspended by a first support and a second end suspended by a second support, the first end being opposite the second end along a first direction, the first and second supports each having a first portion with a first thickness along a second direction transverse to the first direction and a second portion with a second thickness along the second direction greater than the first thickness, the first end of the substrate being suspended on the first portion of the first support and the second end of the substrate being suspended on the first portion of the second support;

removing a first portion of the substrate from the seed SiC layer by at least partially melting the substrate, the first portion being a continuous portion extending entirely from the first end to the second end along the first direction;

forming a second SiC layer on a first surface of the seed SiC layer, the second SiC layer entirely covering the first surface, the forming the second SiC layer including:

generating a first stress in the second SiC layer by introducing into the reaction chamber a precursor in gaseous phase of a first dopant having a first electrical conductivity; and generating a second stress in the second SiC layer that is opposite to the first stress by introducing into the reaction chamber a precursor in gaseous phase of a second dopant having a second electrical conductivity opposite to the first electrical conductivity; and removing a second portion of the substrate from the first SiC layer, the second portion being a residual portion remaining after removal of the first portion, completely by etching from the first SiC layer.

17. The method of claim 16, wherein the forming the second SiC layer further includes carrying out a CVD growth in the presence of the precursors of the first and second dopants.

18. The method of claim 16, wherein the first electrical conductivity is of an N type, the second electrical conductivity is of a P type, the first stress is of a compressive type and the second stress is of a tensile type.

\* \* \* \* \*